United States Patent [19]
Thompson et al.

[11] Patent Number: 5,156,174
[45] Date of Patent: Oct. 20, 1992

[54] SINGLE WAFER PROCESSOR WITH A BOWL

[75] Inventors: Raymon F. Thompson; Aleksander Owczarz, both of Kalispell, Mont.

[73] Assignee: Semitool, Inc., Kalispell, Mont.

[21] Appl. No.: 640,205

[22] Filed: Jan. 11, 1991

Related U.S. Application Data

[62] Division of Ser. No. 526,243, May 18, 1990.

[51] Int. Cl.⁵ .............................................. B08B 3/02
[52] U.S. Cl. ...................................... 134/153; 134/183; 134/200; 134/902; 134/157
[58] Field of Search ............... 134/138, 140, 157, 153, 134/902, 200, 182, 172, 173, 183; 414/225, 226

[56] References Cited
U.S. PATENT DOCUMENTS

| | | | |
|---|---|---|---|
| 3,136,323 | 6/1964 | Martz et al. | 134/153 |
| 3,494,815 | 2/1970 | Yoshimatsu et al. | 134/153 X |
| 4,027,686 | 6/1977 | Shortes et al. | 134/902 X |
| 4,161,356 | 7/1979 | Giffin et al. | 134/902 |
| 4,745,422 | 5/1988 | Matsuoka et al. | 134/902 X |
| 4,788,994 | 12/1988 | Shinbara | 134/902 X |
| 4,871,417 | 10/1987 | Nishizawa | 134/902 |
| 4,922,277 | 5/1990 | Carlson et al. | 134/902 |

Primary Examiner—Frankie L. Stinson
Attorney, Agent, or Firm—Wells, St. John, Roberts, Gregory & Matkin

[57] ABSTRACT

A single wafer processing apparatus includes a portable processing head that can be a portable module or a movable unit mounted to a supporting machine frame. The processing head has movable fingers adapted to grip a wafer. The fingers protrude from a protective wafer plate. Indexing and rotation monitoring assemblies are provided for automation of the wafer processing steps. A complementary processing base includes an upwardly-open bowl that receives a wafer held by the portable processing head. It has a full-diameter movable bottom wall for rapid draining purposes. Liquid and/or gas jets and nozzles supply fluids required within the bowl for processing of wafers.

14 Claims, 11 Drawing Sheets

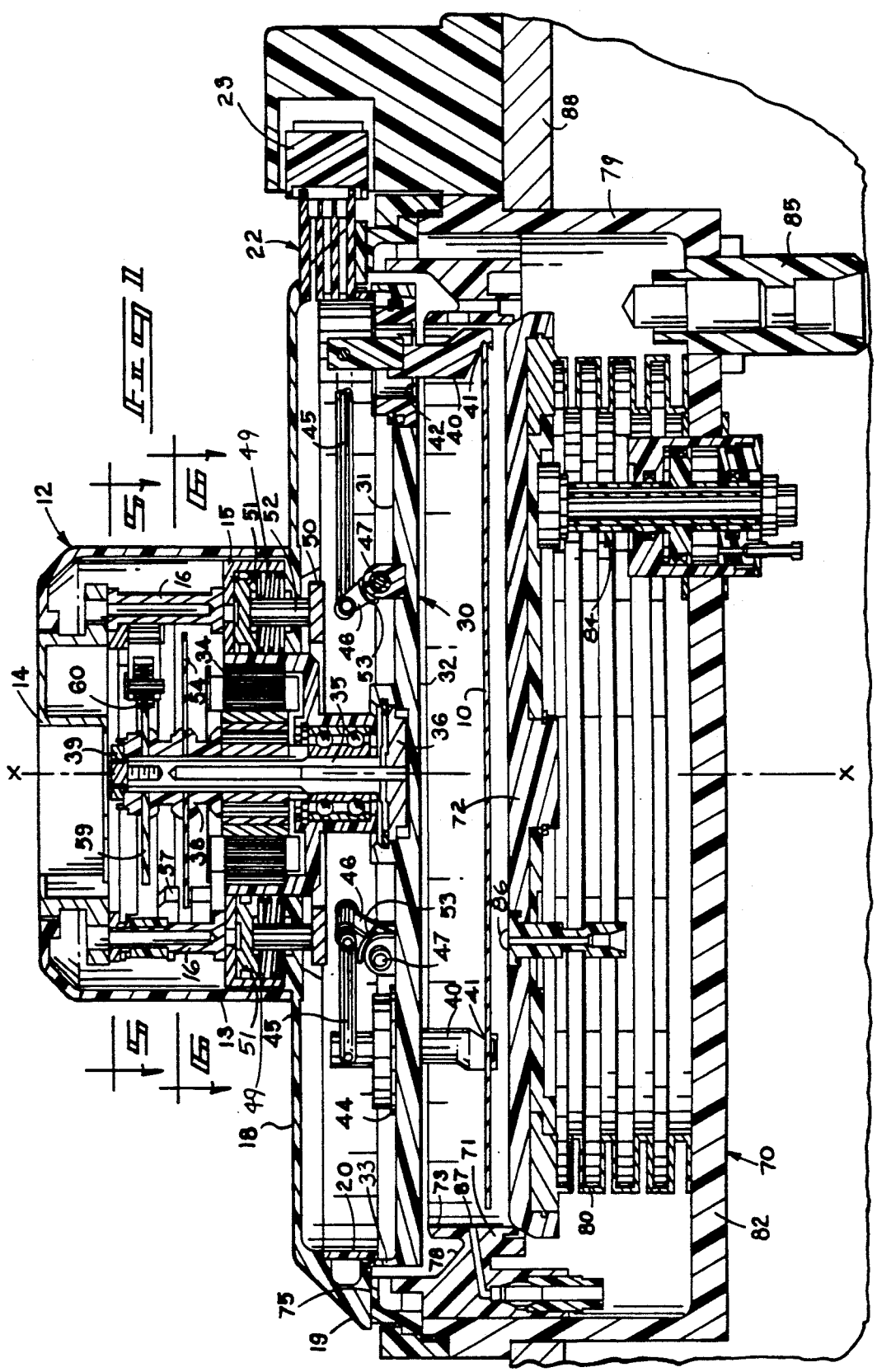

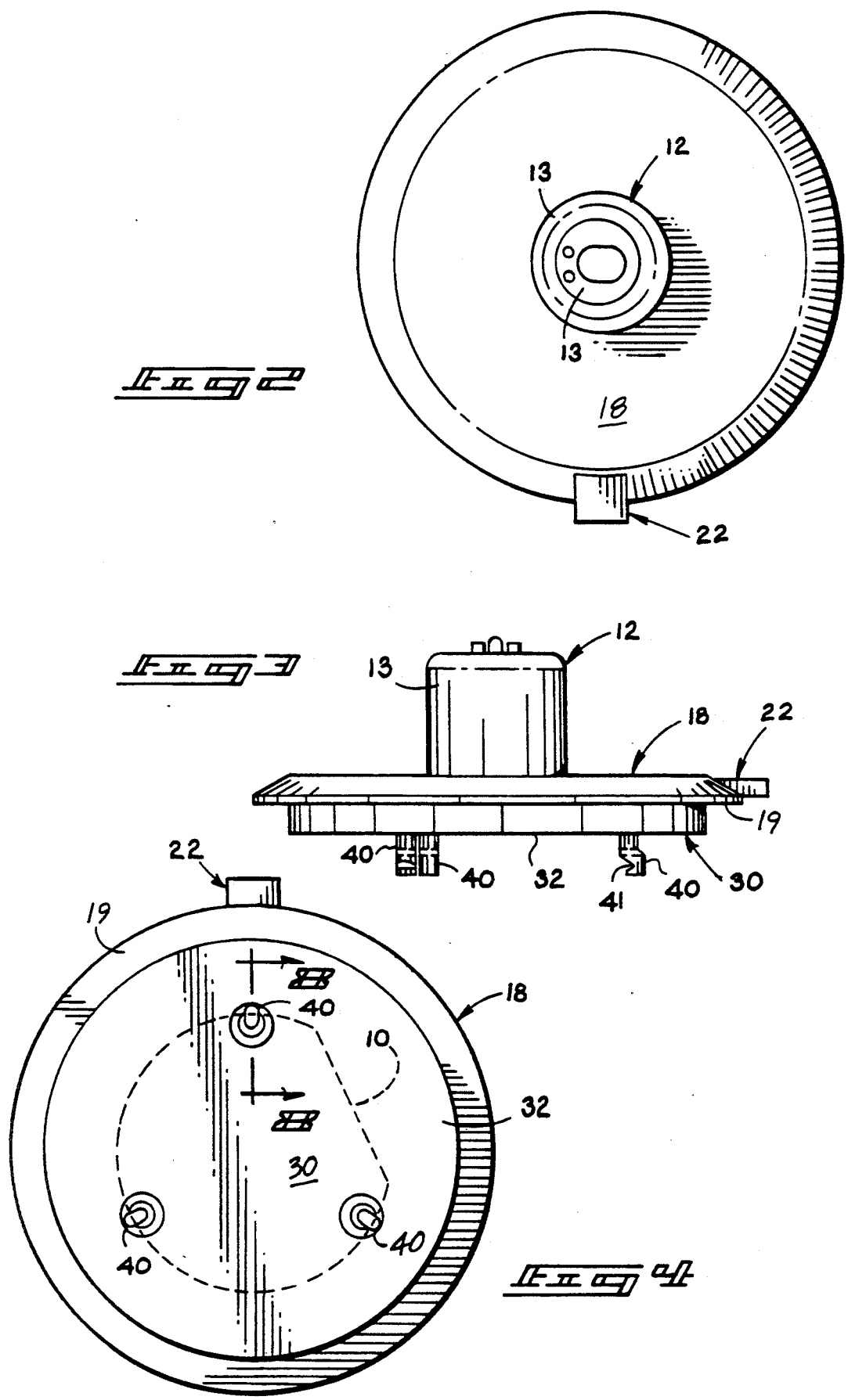

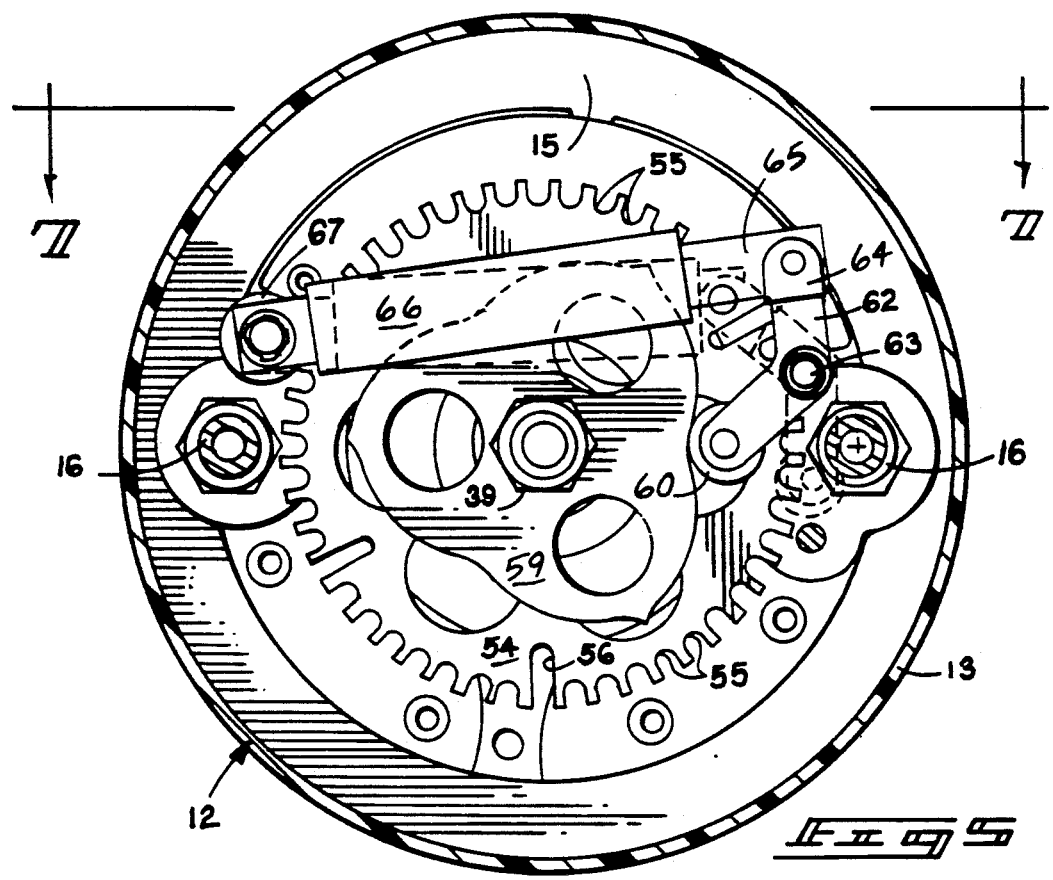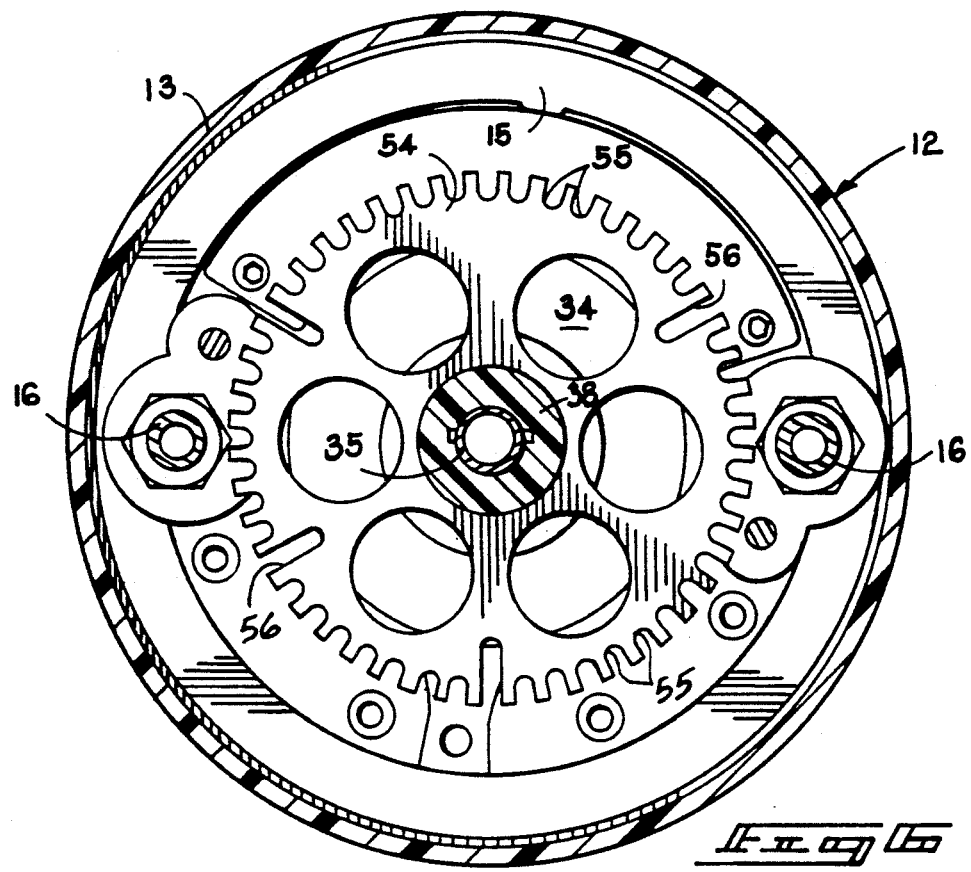

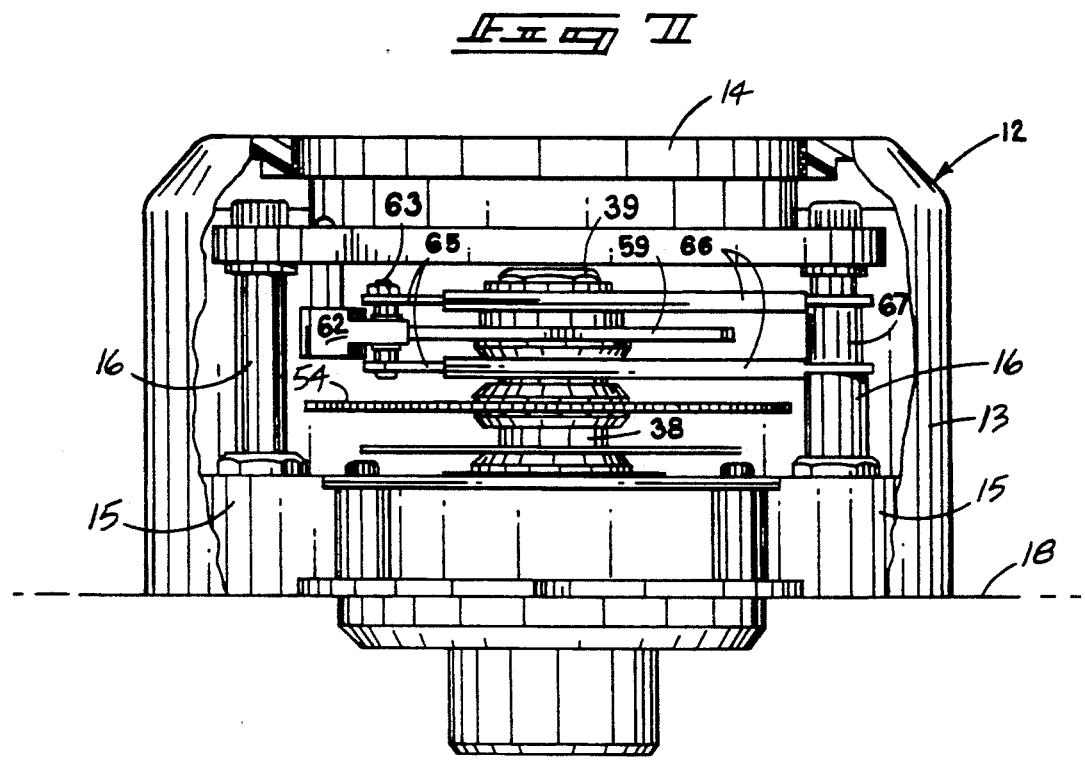
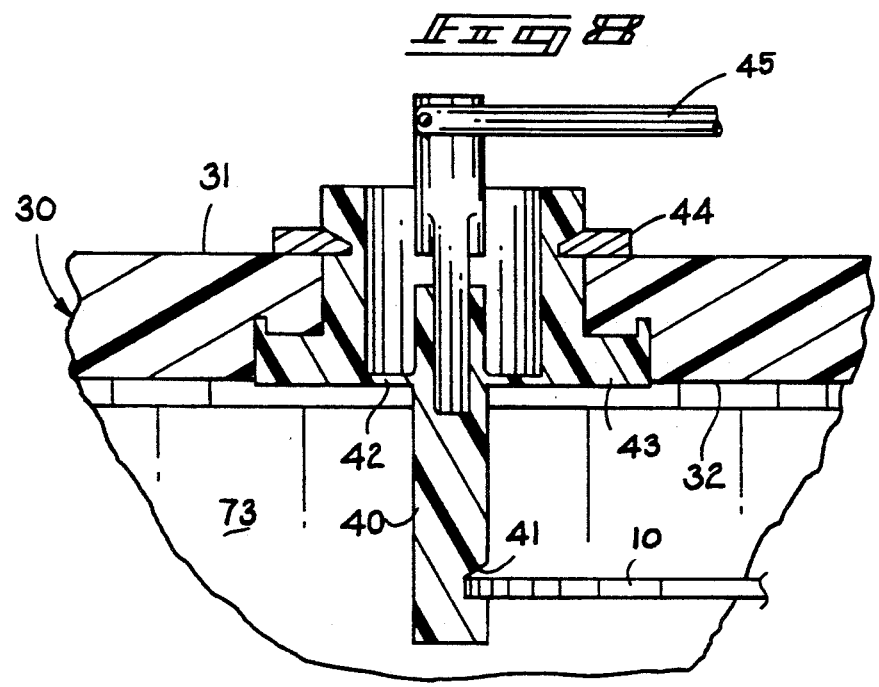

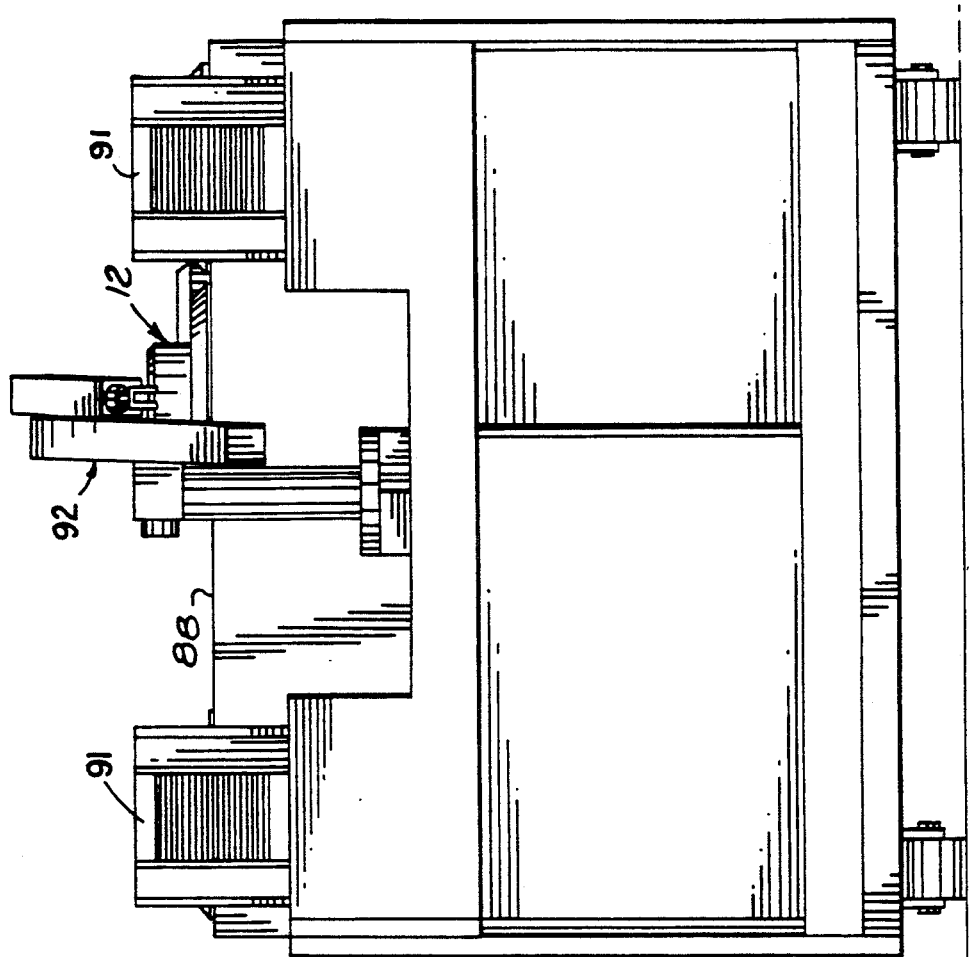
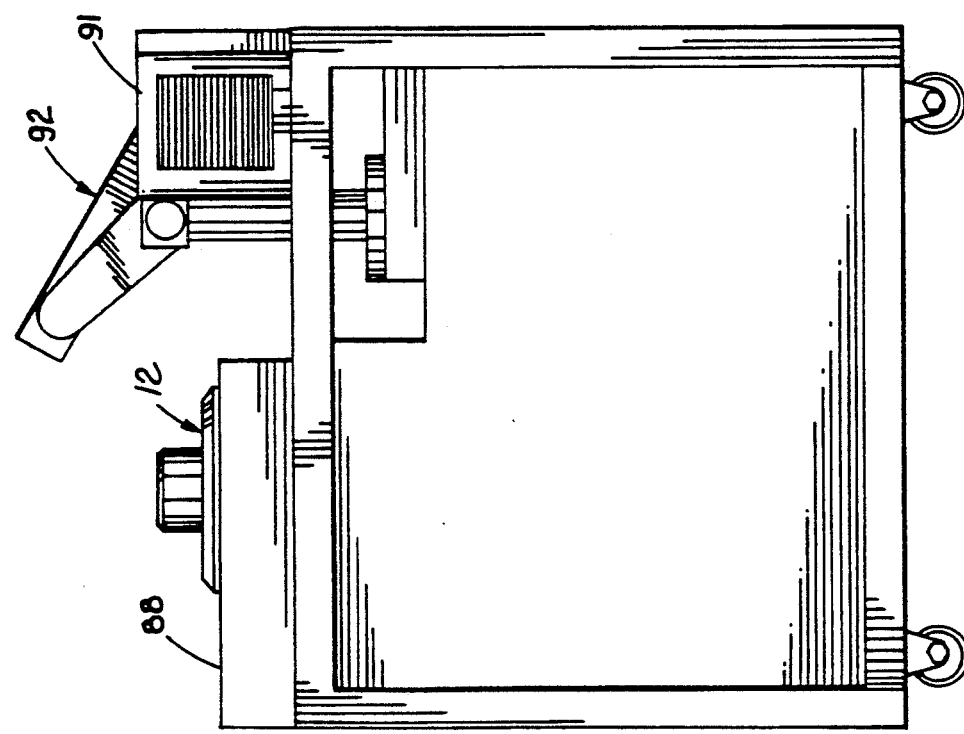

SINGLE WAFER PROCESSOR WITH A BOWL

This application is a division of pending application Ser. No. 526,243 filed on May 18, 1990, and titled "Single Wafer Processor Apparatus" now pending.

TECHNICAL FIELD

This disclosure relates to single wafer processors for holding, transporting and processing individual semiconductor wafers in conjunction with fluid treatment of at least one wafer surface.

BACKGROUND OF THE INVENTION

Chemical processing of semiconductor wafers and similar substrates is often carried out with respect to relatively large batches of wafers. Typically as many as twenty or thirty wafers are simultaneously immersed in a fluid (liquid or gas) or are subjected to fluid sprays. While this is highly effective for rinsing and drying of wafers, as well as for many conventional high volume manufacturing applications, it is of questionable economy where more expensive wafers or substrates are being processed, particularly during more complex or critical processing conditions. Such large-scale batch treatments of wafers multiply potential loss due to malfunction in the processing steps. Batch handling of wafers also interrupts the normal individualized handling and development of more expensive and exotic wafers or substrates.

Individual handling and processing of wafers has also been increasingly dictated by the greater size of wafers coming into use today, as compared to earlier wafers. Where wafers once were two or three inches in diameter, some are now as large as eight inches in diameter, and wafers having a diameter of twelve inches are being used experimentally. This increase in size drastically increases the number of devices on each wafer, and correspondingly increases their potential value. Manufacturers can no longer economically risk the loss of such large numbers of devices to the many unpredictable variations encountered in batch processing operations.

The present invention was developed to minimize such economic losses by handling only a single wafer. It also adapts readily to existing single wafer production techniques common in the semiconductor industry. Furthermore, in contrast with the treatment of large batches of parallel wafers arranged in a stack, the single wafer process as described herein permits treatment of one wafer surface (by application of liquid sprays) as well as both wafer surfaces (by immersion treatment). It also readily accommodates robotic transfer of each wafer between processing units and other automated handling equipment. Indexing and rotation of each wafer can be controlled to meet precise processing requirements.

The use of individual bowls in which process steps for single wafers are conducted also allows the user to minimize the amount of fluid required for wafer processing. The smaller fluid volume requirements permit use of fresh fluid with respect to each wafer, thereby minimizing the amount of contamination that might otherwise be encountered when recirculating fluids in larger volume systems.

The present invention pertains to components of a single wafer processing station that includes a processing base and a complementary processing head. The processing head can be portable for movement from one location to another with no restrictions on its orientation or location, or can be movably mounted relative to a common frame supporting the processing base. The details of the processing head and processing base are subject to a number of variations, depending upon the specific wafer processes to which they are directed.

BRIEF DESCRIPTION OF THE DRAWINGS

The preferred embodiment of the invention is illustrated in the accompanying drawings, in which:

FIG. 1 is a central cross-sectional view through the apparatus;

FIG. 2 is a top plan view of the wafer support;

FIG. 3 is a side elevational view;

FIG. 4 is a bottom plan view;

FIG. 5 is an enlarged sectional view taken along line 5—5 in FIG. 1;

FIG. 6 is an enlarged sectional view taken along line 6—6 in FIG. 1;

FIG. 7 is a side elevational view of the indexing and motion monitoring assemblies as seen along line 7—7 in FIG. 1;

FIG. 8 is an enlarged fragmentary sectional view taken along line 8—8 in FIG. 4;

FIG. 10 is a front view;

FIG. 11 is an end view;

DETAILED DESCRIPTION OF THE PREFERRED EMBODIMENTS

Figure 9:
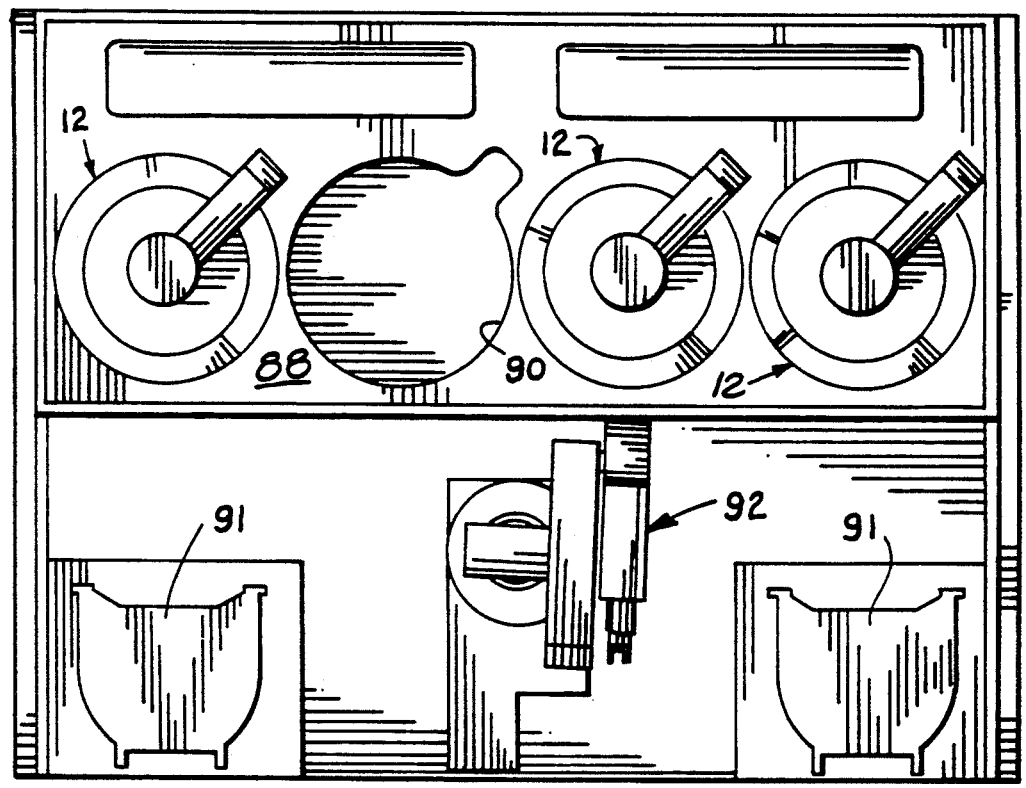
FIG. 9 is a top view of a four station processing machine.
Figure 12:
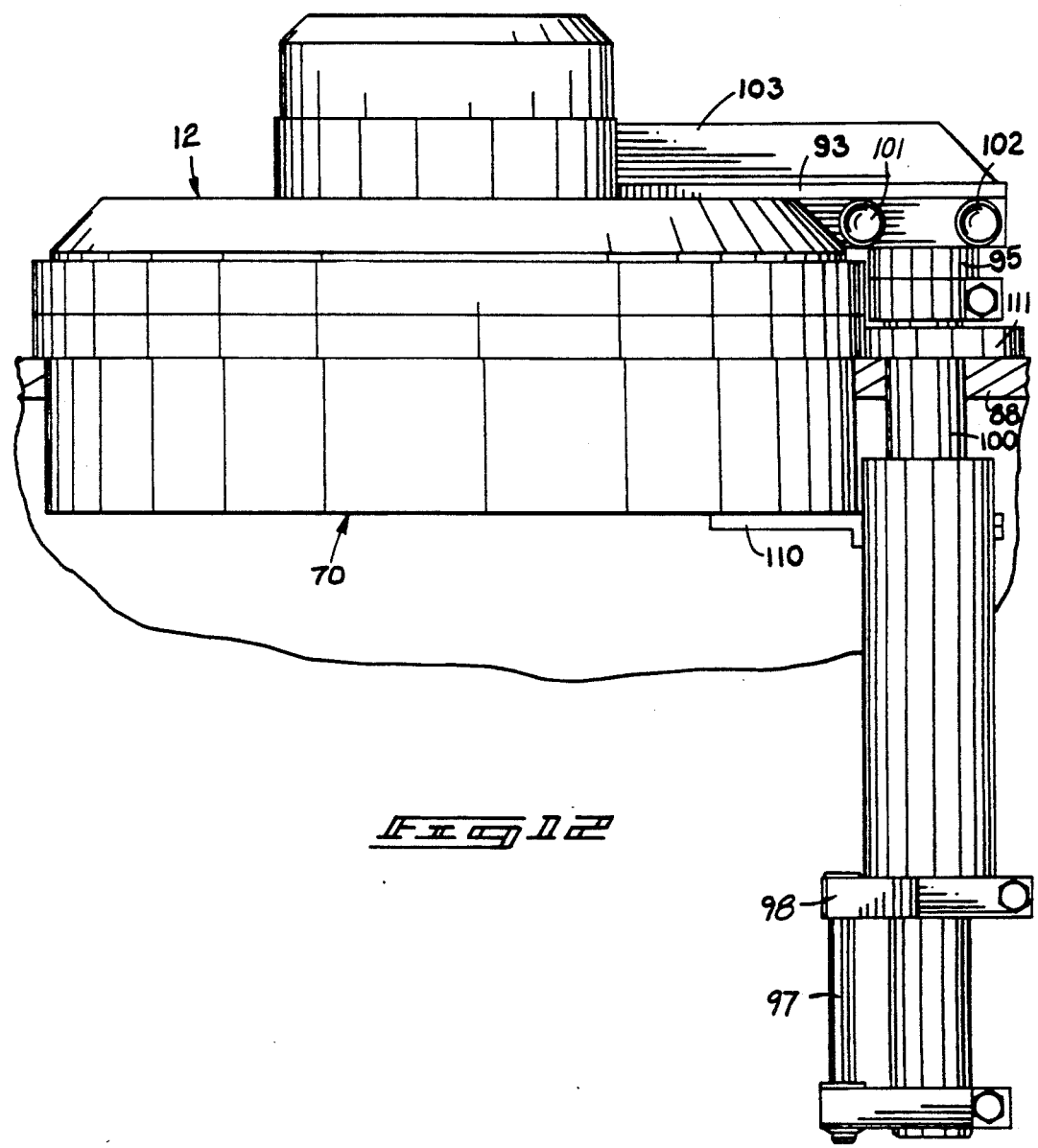
FIG. 12 is a side elevation view of the processing station components in a closed position.
Figure 13:
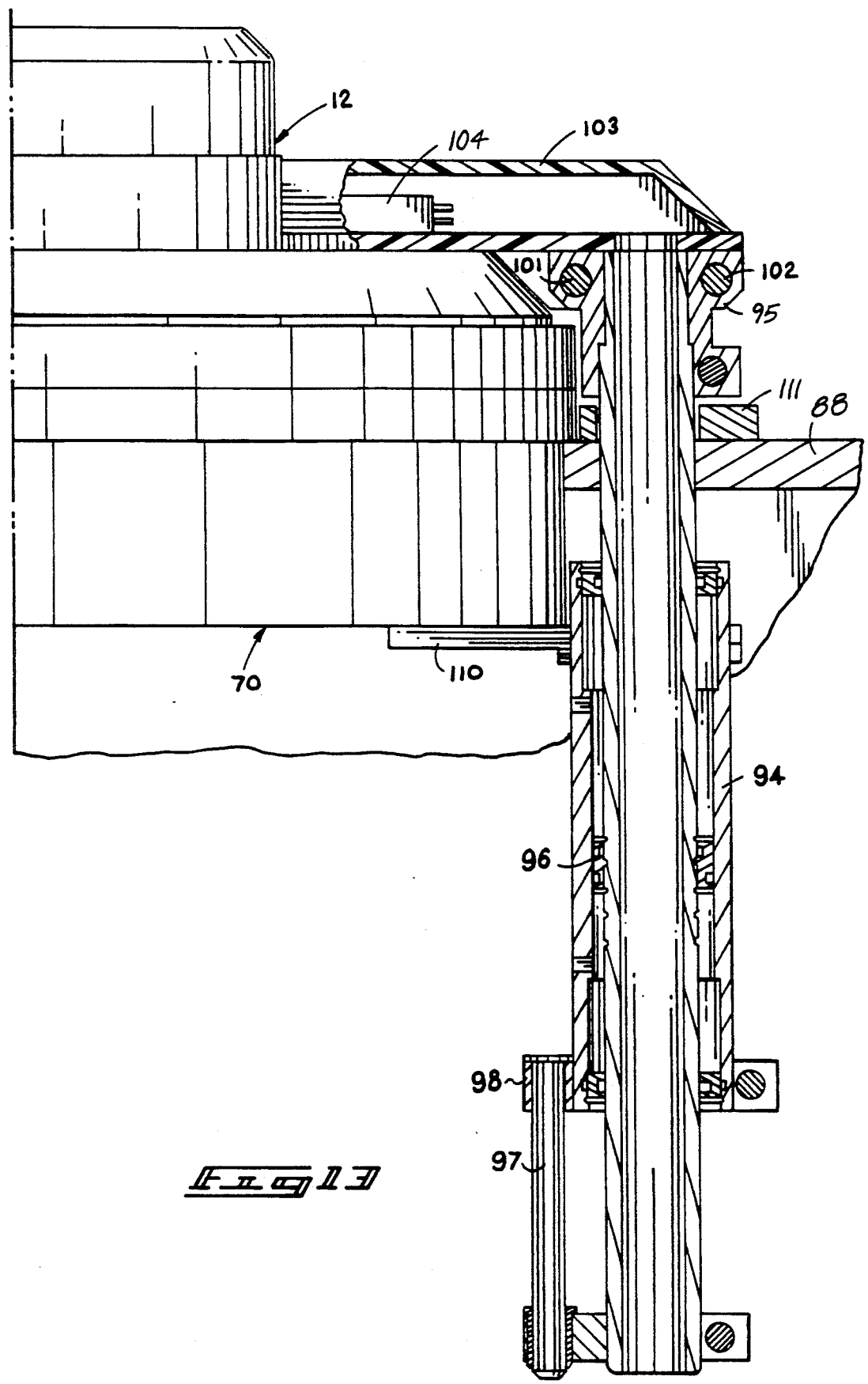
FIG. 13 is an enlarged partial sectional view of the processing head support.
Figure 14:
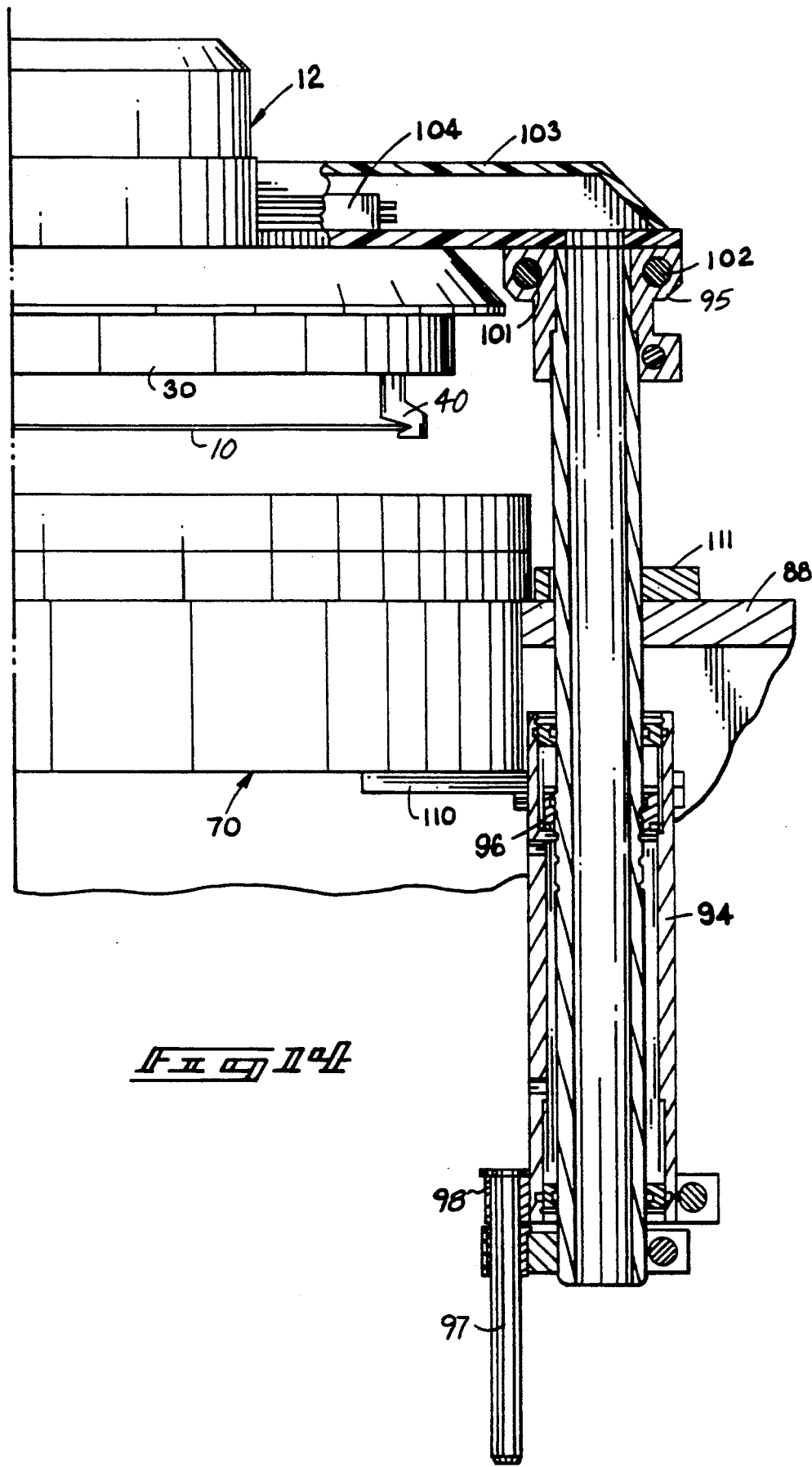
FIG. 14 is similar to FIG. 12, showing the processing station in an open condition.

The following disclosure of the invention is submitted in furtherance with the constitutional purpose of the Patent Laws "to promote the progress of science and useful arts" (Article 1, Section 8).

A single wafer processing apparatus constructed according to this invention might include a processing head that is constructed as a fully portable unit (FIGS. 1-8) for engagement by a conventional robotic arm or as a movable module (FIGS. 9-16) mounted on a machine base.

When used as an attachment to a robotic arm, the processing head can be moved to or from a wafer receiving and discharging station. There wafers can be automatically or manually placed or removed between movable fingers carried by the processing head. The processing head can also be moved to one or more receiving bases mounted in horizontal or upright orientation in a processing cabinet housing chemical cells and supplies of liquids and gases required during a specified process for the wafer.

When movably mounted on a machine frame, the processing head can be robotically loaded or unloaded in a first open position relative to the frame and can be shifted to a processing position or positions relative to one or more complementary processing bases on the frame.

The above equipment is described only for the purpose of illustrating the general environment within which this wafer processing apparatus might be utilized. Further details of the supporting robotic and process equipment are not believed necessary for an understanding of the present invention, which relates to the structure and operation of the processing head and complementary processing base.

The processing head, shown designated generally at 12 in the drawings, is designed for handling a single semiconductor wafer 10 (FIG. 1) having at least one surface to be subjected to contact with a processing fluid. The processing head 12 can transport an engaged wafer 10 to and from a processing base 70, either as a free-standing portable module or as a captive movable unit on a common machine frame. In both instances, the processing head has the capability of selectively rotating an engaged wafer 10 while the wafer is suspended below it within a processing fluid or while one or both wafer surfaces are subjected to a fluid spray or stream.

The processing head 12 is centered about a first reference axis, shown in FIG. 1 as axis X—X. Mounting means is provided on the processing head for attaching it to a movable support. The processing head 12 detailed in FIGS. 1-8 has a mount 14 adapted to be attached to a robotic support (not shown), such as an articulated arm capable of moving the processing head 12 to a variety of positions and orientations during handling of a wafer. The mount 14 is of conventional design complementary to the robotic equipment with which it is to be used. Its details are unnecessary to an understanding of the present improvements.

Processing head 12 includes a removable cover 13, a structural motor base 15 and rigid supporting spacers 16 that fix mount 14 to motor base 15. Processing head 12 also includes a radially enlarged circular shroud 18 that is outwardly open along axis X—X. The dished shroud 18 is fixed across one axial end of the processing head 12. Shroud has a peripheral rim centered about the reference axis X—X adapted to elevationally support the processing head 12 with its one axial end facing downwardly;

A solid wafer plate 30 is coaxially centered about the axis X—X at the one axial end of the processing head 12. Wafer plate 30 is a rigid circular disk having opposed inner and outer surfaces 31, 32 and an inwardly projecting peripheral flange 33. The outer peripheral corner formed about the circular wafer plate 30 is relatively sharp and well-defined to facilitate the radial exit of fluid along its outer surface 32.

Flange 33 overlaps a complementary cylindrical flange 20 about the interior of shroud 18, and closely abuts a peripheral horizontal flange 19 about the rim of shroud 18. The flanges 19, 20 and 33 form a baffle to prevent entry of liquid into the open chamber between the nonrotatable shroud 18 and the rotatable wafer plate 30. The horizontal flange 19 further serves as a support for processing head 12 while resting on a processing base 70 in an inverted position, as shown in FIG. 1.

The periphery of shroud 18 also mounts a radially projecting electrical coupler 22 adapted to be connected to an electrical receiver 23 on a complementary processing base 70. Electrical power and control circuits for the equipment within the processing head 12 are completed by this connection. The electrical coupler and receiver 22, 23 are of conventional design. Their details are unnecessary to an understanding of the present improvements.

Drive means are provided in the processing head. The drive means is operably connected to the gripper means for selectively rotating the gripper means relative to the processing head 12 and shroud 18 about the reference axis X—X.

The wafer plate 30 is selectively rotated by a motor 34 located within cover 13. Motor 34 rotatably powers a driven shaft 35 having an enlargement 36 fastened to the inner surface 31 of wafer plate 30. The driven shaft 35 in turn is powered by a surrounding tubular motor drive shaft 38. Driven shaft 35 and drive shaft 38 are coaxially centered about the reference axis X—X of processing head 12.

The drive shaft 38 and driven shaft 35 are axially splined to one another. They are held in an assembled condition by an enlarged nut 39 that threadably engages driven shaft 35 and radially overlaps the inner end of drive shaft 38.

The above-described shaft assembly permits easy substitution of wafer plates 30 as required to support wafers 10 of different configurations or sizes. Substitution or repair of a wafer plate 30 can be readily accomplished by removal of nut 39 at the outer end of the portable processing head. One can then move the driven shaft 35 and wafer plate 30 axially from the remainder of the processing head 12. No interior access is required in the vicinity of wafer plate 30 to accomplish its assembly or disassembly.

Gripper means is provided on the processing head 12 for holding a wafer 10 in a coaxial position perpendicular to the reference axis X—X, the gripper means being axially and radially overlapped by shroud 18. The gripper means includes a plurality of movable gripping fingers 40 which selectively hold a wafer 10 at a location adjacent to the outer surface 32 of wafer plate 30. The fingers 40 protrude axially to both sides of the wafer plate 30. Each is notched at 41 adjacent to its outer end to receive and engage the edges of a wafer 10.

Fingers 40 are geometrically arranged about the reference axis of processing head 12 to receive and grip a wafer 10 within notches 41 in a coaxial position perpendicular to the axis X—X. Three fingers 40 are shown in the illustrated apparatus, but four or more fingers can be used when desired.

As shown in FIG. 8, each finger 40 is individually mounted in the wafer plate 30 within a flexible supporting diaphragm 42. The periphery of each diaphragm 42 presents a seal 43 engageable within the periphery of a complementary aperture formed through the wafer plate 30. The inner periphery of the seal is releasably held in place by a snap ring 44. Each diaphragm 42 is molded or otherwise formed integrally with one finger 40. This integral connection and support for the individual fingers 40 eliminates seams or openings across the wafer plate 30, while permitting the limited movement of finger 40 required to engage or disengage a wafer 10. Only the operative wafer-engaging section of each finger 40 is exposed to the processing fluids and gases outwardly of the wafer plate 30.

Finger control means are located inwardly of the wafer plate 30 in the processing head 12 for moving fingers 40 in unison between closed positions engaging a wafer between them and open positions to permit receipt or discharge of a wafer. The finger control means comprises a combination of individual lever assemblies mounted about the inner surface 31 of wafer plate 30 and a common actuator assembly mounted within the motor base 15.

The common actuator assembly is operably engageable with the individual lever assemblies for selectively moving the fingers in unison from their closed positions to their open positions. The actuator assembly does not physically engage the individual lever assemblies during normal operation and rotation of the wafer plate 30 in conjunction with the processing of a wafer 10.

The individual lever assemblies are connected respectively to the individual fingers 40. They yieldably bias fingers 40 to their closed positions and selectively move the fingers to their open positions. Each of the individual lever assemblies for the fingers 40 includes a radial linkage bar 45 spaced inwardly from wafer plate 30. The outer end of each linkage bar 45 is pivotally connected to the inner end of the finger 40 controlled by it. Its inner end is pivotally connected to a pivot arm 46 mounted to a parallel pivot shaft 47. A torsion spring 53 wrapped about each pivot shaft 47 yieldably urges the associated pivot arm 46 to an upright or inwardly protruding position as illustrated in FIG. 1, where the fingers 40 are in a closed position parallel to the reference axis X—X.

An annular push ring 50 overlies the inner ends of the linkage bars 45 adjacent to the motor base 15. Motor base 15 has two cylinders formed diametrically apart through reference axis X—X. Each mounts an axially movable pneumatic piston 51 having a protruding piston shaft 52 fixed to the push ring 50.

Pistons 51 are inwardly biased by surrounding compression springs 53. Piston springs 53 normally maintain push ring 50 clear of engagement with the underlying linkage bars 45. When compressed air is directed to the inner side of piston 51, the piston shaft 52 and push ring 50 extend axially to depress the pivot arms 46 about pivot shaft 47 and thereby pull the inner ends of fingers 40 radially inward to permit a wafer 10 to be positioned for subsequent gripping by the fingers 40. The gripping movement is effected by the yieldable spring forces on pivot arms 46 when the pressure of push ring 50 is released by terminating application of pneumatic pressure to the piston 51.

It is important to provide control of the angular positions of fingers 40 about reference axis X—X to accommodate the needs of automated equipment for loading and unloading of wafers. Indexing means for this purpose is provided within processing head 12. It selectively positions the fingers 40 in preselected angular locations about the reference axis when the wafer plate 30 is not being rotated by motor 34.

Indexing is accomplished by a multi-sided rotor plate 59 having a plurality of sides equal in number to the fingers 40 on a particular wafer plate 30 with which it is used. Each side of rotor plate 59 has a curved edge configuration (shown in FIG. 5) that serves as a detent in combination with an inwardly-biased roller 60. When the motor 34 is inoperative and drive shaft 38 is freely rotatable, the inward biasing force of roller 60 will cause rotor plate 59 to pivot an angular amount necessary to center roller 60 across the engaged side of rotor plate 59 in the centered position shown in FIG. 5.

Roller 60 is mounted at one end of a crank arm 62 pivotally supported on a supporting shaft 63 depending from the mount 14. The opposite end of crank arm 62 includes a clevis 64 pivotally joined to the outer ends of two parallel piston rods 65 that are part of two parallel pneumatic cylinder assemblies 66. The remaining ends of the cylinder assemblies 66 are pivotally mounted about a parallel axis on a spacer 67 that joins the motor base 15 and mount 14.

The cylinder assemblies 66 are normally spring biased to a retracted position where roller 60 is radially clear of the rotor plate 59, which rotates in unison with the drive shaft 38. However, when rotation of drive shaft 38 terminates and indexing of the wafer plate 30 is required, the cylinder assemblies 66 are extended. This forces roller 60 radially inward against the edge of rotor plate 59 and properly centers the rotor plate as shown. The detent assures that the fingers 40 are angularly indexed when stationary to thereby meet operational requirements of associated robotic wafer handling equipment.

A motion monitoring assembly is also provided within processing head 12 for measuring the speed and direction of rotation of the wafer plate 30 about the reference axis X—X. This is illustrated by an optical disk 54 fixed to the drive shaft 38 and provided with a plurality of small notches 55 and interspersed large notches 56. One or more optical sensor 57 overlie disk 54 to read the two sets of notches. The positions of the large notches 56 are utilized to confirm the angular position of the rotor plate 59 and held by the detent roller 60 in a stationary position. Additional sensors can be utilized to measure speed and direction of the disk by monitoring movement of the small notches 55. The details of such optical monitoring are well known and not necessary to an understanding of the present improvements.

The general details of the processing base 70 are shown in the cross-sectional presentation of FIG. 1. It basically comprises an upwardly open bowl formed by a combination of a stationary circumferential upright wall surface 71 and an axially movable bottom wall 72. The bottom wall 72 is adapted to be shifted axially to sealingly engage the bottom edge of the upright wall 71. When lowered, the bottom wall 72 allows any liquid within the bowl to drain about its full periphery.

The upright wall surface 73 and outer surface of bottom wall 72 together form an upwardly-open bowl interior centered about a second reference axis. This second reference axis of the processing base 70 is also identified in FIG. 1 by axis X—X, since the first and second reference axes of the portable processing head and supporting processing base 70 are coaxial when used in conjunction with one another.

The inner diameter of the cylindrical surface 73 within the bowl relative to the axis X—X is greater than the outside diameters of the fingers 40 relative to the axis. This provides clearance within the upwardly open bowl for reception of the gripping fingers 40 which position a wafer 10 within the bowl interior.

Mounting means is located about the bowl for selectively holding a processing head with the first and second reference axes in a fixed coaxial relationship illustrated by axis X—X in FIG. 1 and with the fingers 40 gripping a wafer within the bowl interior. The mounting means comprises an upwardly-facing peripheral flange 75 extending radially outward about the upright wall 71. The flange 75 is complementary to the flange 19 formed about shroud 18, which freely rests upon it to properly locate the processing head 12 on the processing base 70.

An annular trough 78 is interposed between the upright wall surface 73 and the supporting flange 75 about the processing base 70. Trough 78 serves to collect liquid that escapes radially outward over the upright wall surface 73 during rotation of the wafer plate 30 and associated wafer 10. It also acts as an overflow for the upwardly open bowl or basin when immersion processing techniques are being carried out within it.

The components of the processing base 70 are located within a base enclosure formed by a surrounding cylindrical wall 79 and lower horizontal wall 82. The walls 72, 82 can be apertured as required for access of hoses, drains, pipes and other supply fittings to the interior of the enclosure. The base enclosure mounts the processing base 70 within a surrounding frame support 88.

The bottom wall 72 of the processing bowl is supported by an annular bellows 80 extending about its full periphery to lower wall 82. Bellows 80 is interposed between the lower wall 82 and the lower wall 72 of the bowl for movably supporting bottom wall 72 during axial movement relative to the upright wall 71.

Linear actuators are provided in the processing base 70 to move the bottom wall 72 parallel to axis X—X between the closed position shown in FIG. 1 and a lowered open position. These linear actuators are illustrated by one pneumatic cylinder assembly 84 in FIG. 1. In actual practice, a plurality of such cylinder assemblies 84 will be provided to move the relatively large bottom wall 72 in the required axial path. A drain 85 is provided in lower wall 82 at the exterior of bellows 80 for carrying away liquid received from within the bowl and from within the previously-described trough 78.

Any suitable number of liquid or gaseous jets or nozzles can be directed into the interior of the bowl. One illustrative jet 86 is shown extending through the movable bottom wall 72, although a plurality of similar jets or nozzles can be provided in any desired geometric pattern to direct fluid or gas against the facing surface of a wafer 10 in the required pattern. Alternatively, nozzles extending through the bottom wall 72 can be used to fill the bowl during processing and to circulate processing fluid as required. Peripheral liquid or gas supply nozzles and jets can also be provided about the cylindrical surface 73, as illustrated by the single jet 87 shown at the left side of FIG. 1.

The processing base 70 lends itself to a wide variety of semiconductor wafer processing techniques requiring spraying of liquids and/or gases, as well as immersion within liquids. The illustrated bowl assembly permits rapid dumping of liquids from within the bowl interior. This is accomplished by moving the bottom wall 72 downwardly, which allows liquid to escape about its full periphery.

FIGS. 9-11 generally illustrate one self-contained machine application for the processing station previously described. In this application, the processing head 12 and processing base 70 are essentially identical to that detailed in FIG. 1. The processing base 70 is stationary and supported by the frame support 88, shown as a horizontal upper cabinet surface interrupted by one or more apertures 90. The open periphery of each aperture 90 is complementary in shape to the exterior of the base enclosure and the adjacent linear actuating mechanism for the processing head 12, which is described below. The interconnection between each processing head 12 and its associated processing base 70 are illustrated in FIGS. 12-16.

The machine shown in FIGS. 9-11 is a processing machine for semiconductor wafers. It includes four processing stations. In the drawings, three of the processing stations are shown with the processing base 70 and processing head 12 in closed positions on the upper surface of a machine cabinet. These components are not shown at the fourth processing station in order to illustrate the general shape of the receiving aperture 90.

The machine cabinet also supports a pair of conventional portable wafer carriers 91 of a type conventionally used for supporting a stack of parallel semiconductor wafers during handling and transport. Incoming wafers would be handled by one carrier and processed wafers by the other.

A universally movable and programmable robotic transfer arm assembly 92 is located centrally on the machine frame 88 for transferring individual wafers between carriers 91 and the four processing stations. The processing stations on a given cabinet might all be used for a common processing method involving application of one or more fluids to the surface(s) of a wafer positioned within them by the processing heads 12, or might be used in a sequence of processing steps wherein wafers are transferred from one processing head 12 to the next by operation of the robotic transfer arm 92.

In the embodiment of the processing head shown in FIGS. 12-16, the processing head 12 is cantilevered by a radial arm 93. The arm 93 is horizontal and upwardly adjacent to the previously-described shroud 18. The outer end of arm 93 is pinned to a support bracket 95 that serves as the previously-described mounting means provided on the processing head for attaching it to a movable support. In this embodiment, the bracket 95 is fixed to the upper end of a vertically movable support shaft 100.

Shaft 100 is hollow and cylindrical. It is slidably surrounded by a supporting tube 94 fixed to the lower wall 82 of the associated base enclosure by a bracket 110. A guide bearing 111 on the base enclosure also surrounds and slidably receives shaft 100 to stabilize its axial movement relative to tube 94.

The upper and lower ends of tube 94 are slidably sealed about the exterior of support shaft 100. An intermediate piston 96 is fixed to the exterior of support shaft 100 within tube 94 and sealingly engages the inside walls of tube 94. This forms a double acting pneumatic cylinder in which shaft 100 is the axially movable member. The support shaft 100 can be urged upwardly by introduction of pressurized air through the lower end of tube 94. It can be urged downwardly by introduction of pressurized air through the upper end of tube 94.

In the form of the processing station shown in FIGS. 12-15, rotation of shaft 100 relative to tube 94 about their coaxial vertical center axis is prevented by a guide rod 97 that depends downwardly from the lower end of tube 94. The guide rod 97 slidably fits within an apertured guide collar 98 fixed to the lower end of support shaft 100. The interaction between guide rod 97 and collar 98 assures proper angular positioning of the processing head 12 about the vertical axis of support shaft 100 to assure proper mating between the processing head 12 and the associated processing base 70.

Figure 15:
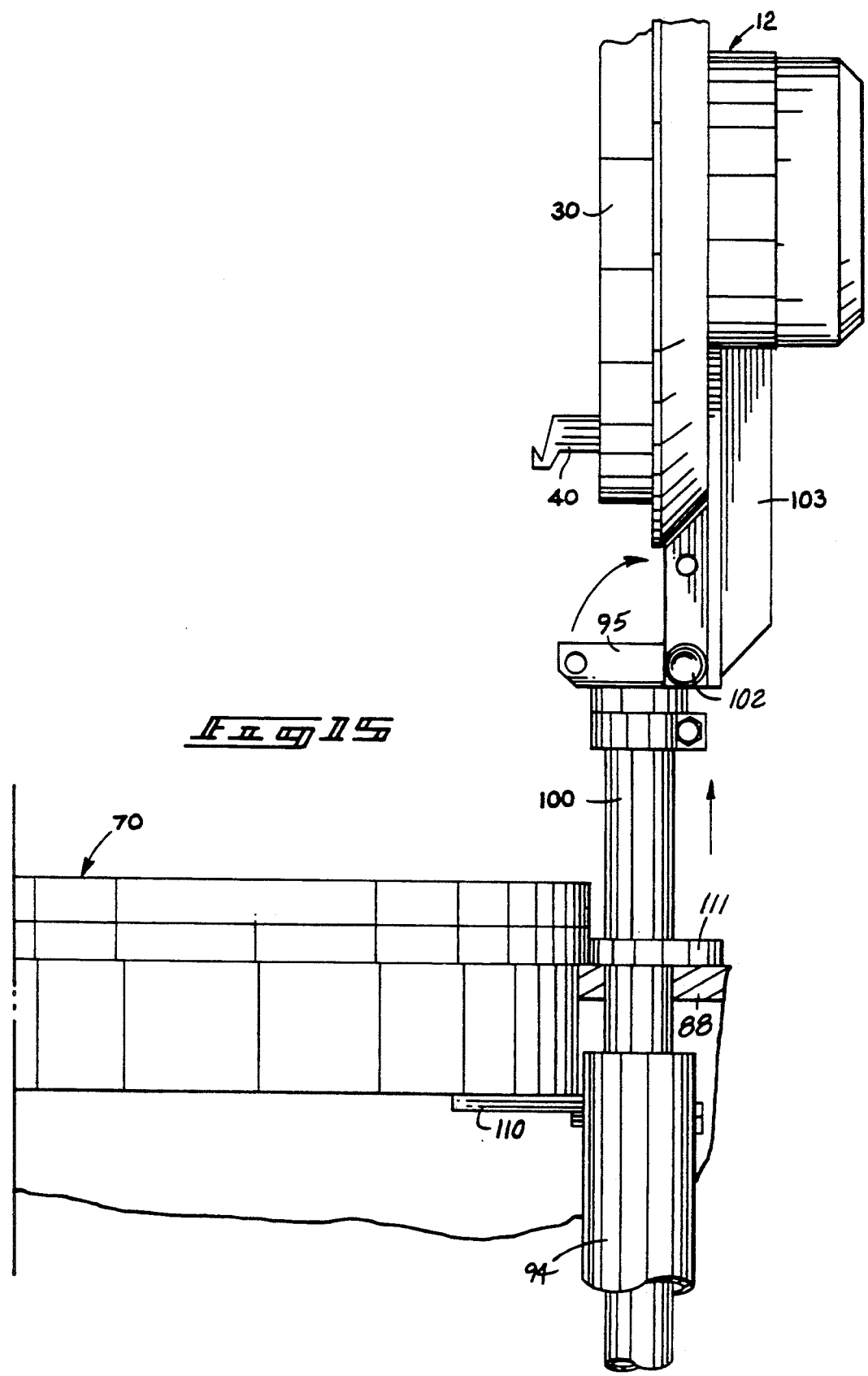
FIG. 15 is a fragmentary side elevation view of the processing station showing the open processing head pivoted to a vertical position.
Figure 16:
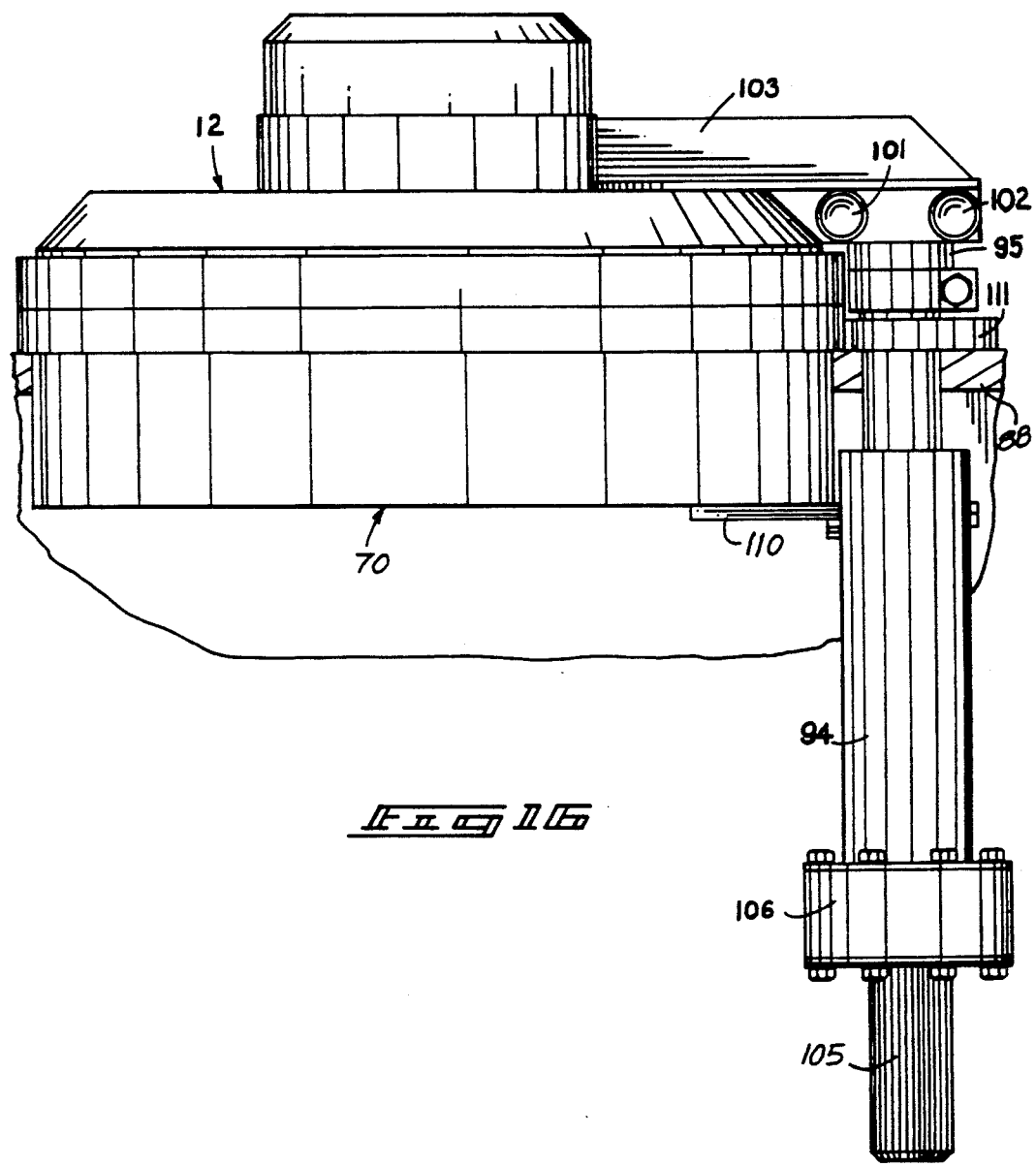
FIG. 16 is a view similar to FIG. 12, showing addition of a rotary actuator for the processing head.

In addition to the limited vertical movement that can be imparted to processing head 12 by operation of the pneumatic cylinder assembly, processing head 12 can be pivoted about a vertically movable horizontal axis to the position shown in FIG. 15. This is accomplished manually by first removing an inner pin 101 interconnecting the outer end of radial support arm 93 and the support bracket 95. Removal of pin 101 frees the processing head 12 for pivotal movement about the horizontal center axis of the remaining pin 102. The processing head 12 might be raised to the position shown in FIG. 15 to permit substitution or repair of the wafer plate 30 and associated equipment, as described above.

Removal of the second pin 102 permits replacement of the entire processing head 12 on the upper end of shaft 100 when such substitution is desired. The electrical connections required between the reciprocable processing head 12 and the interior of the machine frame 88 can be made by flexible cables extending through the hollow support shaft 100 to a detachable electrical coupling 104 housed within a removable cover 103 that forms part of the radial support arm 93.

The processing heads 12 illustrated in FIGS. 9-15 are capable of limited vertical movement relative to the machine frame 88. They pop up and down in response to pneumatic pressure applied to their respective supporting pneumatic cylinder assemblies. When in their raised positions, the exposed fingers 40 can be spread apart to facilitate transfer of a wafer by operation of the robotic transfer arm 92. When lowered, the fingers 40 engage and locate a wafer 10 within the upwardly open processing bowl for exposure to processing fluids.

In some instances it might be desired to also impart rotational movement to the processing head 12 relative to the vertical center axis of shaft 100. As an example, such rotary action might shift the raised processing head 12 between two or more processing bases 70 positioned angularly about the vertical axis of support shaft 100 to sequence the wafer gripped by the processing head 12 through two or more processing steps.

Such pivotal movement can be accomplished as illustrated in FIG. 15, where a rotary actuator 106 has been substituted for the vertical guide rod 97 and guide collar 98 shown in the preceding embodiment. Rotary actuator 106 can be a hydraulic motor or electric motor designed to turn processing head 12 about the axis of shaft 100 any desired angular distance.

The rotary actuator 106 can be selectively operated to pivot the lower end of shaft 100 about its central vertical axis through interconnecting splines 105. The splines 105 can also accommodate vertical movement of shaft 100 and processing head 12 in response to actuation of the pneumatic cylinder assembly described above and illustrated in FIG. 13.

The apparatus described in FIGS. 9-16 maintains each wafer 10 elevationally beneath the processing head 12, where it the wafer is protected from contamination by contact of falling particulates. The complementary processing heads 12 and processing bases 70 form enclosures that minimize contamination within the space where processing of each wafer takes place. When desired, this space can be pressurized by introduction of compressed neutral gases to assure that contaminants cannot enter the enclosure formed by the processing head 12 and base 70.

The above-described processing stations are extremely versatile. They adapt to installations where it is desired that wafers are moved to and from a head movably supported on a processing cabinet or frame, as well as to installations where the head is required to be moved between multiple wafer handling and processing stations. In each type of installation, the wafers are securely and accurately gripped by the supporting fingers 40, and the adjacent shroud 18 is available to cover the wafer and minimize contamination of its surfaces during movement of the processing head 12.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A single wafer processor, comprising the combination of:
    a processing head centered about a first reference axis and including:
    a solid circular wafer plate having oppositely facing inner and outer surfaces coaxially centered about the first reference axis at one axial end of the processing head;
    drive means operably connected to the wafer plate for selectively rotating it about the first reference axis;
    a plurality of movable gripping fingers protruding outwardly from the wafer plate, the gripping fingers being arranged about the first reference axis for selectively holding a wafer adjacent to the outer surface of the wafer plate; and
    a processing base, including:
    a bowl including a stationary upright wall provided with a circumferential surface leading axially to a peripheral bottom edge and an axially movable bottom wall adapted to be shifted axially to sealingly engage the bottom edge of the upright wall, the upright wall surface and bottom wall together forming an upwardly-open bowl interior centered about a second reference axis;
    the diameter of the upright wall surface relative to the second reference axis being greater than the outside diameters of the fingers relative to the first reference axis; and
    mounting means located about the bowl for selectively holding the processing head with the first and second reference axes in a fixed coaxial relationship and with the fingers gripping a wafer within the bowl interior.

2. The single wafer processor of claim 1 wherein the mounting means comprises:
    an upwardly-facing peripheral flange extending radially outward about the upright wall.

3. The single wafer processor of claim 1 wherein the mounting means comprises:
    an upwardly-facing peripheral flange extending radially outward from the upright wall surface;
    the processing base further comprising:
    an annular trough interposed between the upright wall surface and the flange for collecting liquid that escapes radially outward over the upright wall surface.

4. The single wafer processor of claim 1 wherein the processing base further comprises:
    an enclosure formed by an upright cylindrical wall and a transverse lower wall extending across the bottom of the cylindrical wall; and
    an annular bellows interposed between the lower wall of the enclosure and the bottom wall of the bowl for movably supporting the bottom wall during axial movement relative to the upright wall of the bowl.

5. The single wafer processor of claim 1 wherein the processing base further comprises:
- an enclosure formed by an upright cylindrical wall and a transverse lower wall extending across the bottom of the cylindrical wall; and
- an annular bellows interposed between the lower wall of the enclosure and the bottom wall of the bowl for movably supporting the bottom wall during axial movement relative to the upright wall of the bowl; and
- drain means extending through the lower wall of the enclosure for receiving liquid at a location radially outward from the bellows.

6. The single wafer processor of claim 1 wherein the processing base further comprises:
- an enclosure formed by an upright cylindrical wall and a transverse lower wall extending across the bottom of the cylindrical wall; and
- an annular bellows interposed between the lower wall of the enclosure and the bottom wall of the bowl for movably supporting the bottom wall during axial movement relative to the upright wall of the bowl; and 7. A processing base designed for use with a movable processing head for a single semiconductor wafer, comprising:
- a stationary processing bowl within which at least one surface of a wafer held by a portable processing head is to be subjected to contact with a processing fluid, the bowl including a stationary circumferential upright wall surface having a peripheral bottom edge and a bottom wall, the bottom wall having a periphery adapted to sealingly engage the bottom edge of the upright wall, the upright wall surface and bottom wall together forming an upwardly-open bowl interior centered about a reference axis, the bottom wall being axially movable to disengage the bottom edge of the upright wall and to allow any fluid within the bowl interior to drain around the full periphery of the bottom wall;
- mounting means located about the bowl for selectively holding a movable processing head in a fixed coaxial relationship and with a wafer axially engaged thereby centered within the bowl interior.

8. The processing base of claim 7 further comprising:
- an upwardly-facing peripheral flange extending radially outward from the upright wall surface.

9. The processing base of claim 7 further comprising:
- an upwardly-facing peripheral flange extending radially outward from the upright wall surface; and
- an annular trough interposed between the upright wall surface and the flange for collecting liquid that escapes radially outward over the upright wall surface.

10. The processing base of claim 7 wherein the processing base further comprises:
- an enclosure formed by an upright cylindrical wall and a transverse lower wall extending across the bottom of the cylindrical wall; and
- an annular bellows interposed between the lower wall of the enclosure and the bottom wall of the bowl for movably supporting the bottom wall during axial movement relative to the upright wall of the bowl.

11. The processing base of claim 7 wherein the processing base further comprises:
- an enclosure formed by an upright cylindrical wall and a transverse lower wall extending across the bottom of the cylindrical wall; and
- an annular bellows interposed between the lower wall of the enclosure and the bottom wall of the bowl for movably supporting the bottom wall during axial movement relative to the upright wall of the bowl; and
- drain means extending through the lower wall of the enclosure for receiving liquid at a location radially outward from the bellows.

12. The processing base of claim 7 wherein the processing base further comprises:
- an enclosure formed by an upright cylindrical wall and a transverse lower wall extending across the bottom of the cylindrical wall; and
- an annular bellows interposed between the lower wall of the enclosure and the bottom wall of the bowl for movably supporting the bottom wall during axial movement relative to the upright wall of the bowl; and
- linear actuator means located radially within the bellows and connected to the bottom wall for moving the bottom wall in a direction parallel to the second reference axis.

13. The processing base of claim 7 further comprising:
- liquid supply means in fluid communication with the bowl interior for selectively filling the bowl with liquid for immersion processing of a wafer.

14. The processing base of claim 7 further comprising:
- jet means in the bottom wall of the bowl for directing liquid upwardly to impinge upon a wafer located in the bowl interior.

* * * * *